(12) United States Patent
Nagano et al.

(10) Patent No.: US 7,294,562 B2
(45) Date of Patent: Nov. 13, 2007

(54) SEMICONDUCTOR SUBSTRATE, METHOD OF MANUFACTURING THE SAME, SEMICONDUCTOR DEVICE, AND METHOD OF MANUFACTURING THE SAME

(75) Inventors: Hajime Nagano, Yokohama (JP); Kiyotaka Miyano, Fujisawa (JP); Ichiro Mizushima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/282,784

(22) Filed: Nov. 18, 2005

(65) Prior Publication Data

US 2006/0076624 A1  Apr. 13, 2006

Related U.S. Application Data

(63) Continuation of application No. 10/439,896, filed on May 16, 2003, now Pat. No. 7,122,864.

(30) Foreign Application Priority Data

Mar. 17, 2003  (JP) .............................. 2003-072218

(51) Int. Cl.
*H01L 21/20* (2006.01)
(52) U.S. Cl. .............................. 438/481; 257/E33.005; 257/E21.09
(58) Field of Classification Search .................. 438/481
See application file for complete search history.

(56) References Cited

U.S. PATENT DOCUMENTS

| 5,740,099 A | 4/1998 | Tanigawa |
| 5,856,696 A | 1/1999 | Blanchard |
| 6,333,532 B1 | 12/2001 | Davari et al. |
| 6,420,764 B1 | 7/2002 | Blanchard |
| 6,531,754 B1 | 3/2003 | Nagano et al. |
| 6,630,714 B2 | 10/2003 | Sato et al. |

FOREIGN PATENT DOCUMENTS

| JP | 5-75053 | 3/1993 |
| JP | 8-222625 | 8/1996 |
| JP | 11-17001 | 1/1999 |
| JP | 2000-223679 | 8/2000 |

*Primary Examiner*—W. David Coleman
(74) *Attorney, Agent, or Firm*—Frommer Lawrence & Haug LLP

(57) ABSTRACT

A semiconductor substrate is disclosed which comprises a first single crystal silicon layer, an insulator formed to partially cover one main surface of the first single crystal silicon layer, a second single crystal silicon layer formed to cover a region of the first single crystal silicon layer which is not covered with the insulator, and to cover an edge portion of the insulator adjacent to the region, and a non-single crystal silicon layer formed on the insulator, the interface between the non-single crystal silicon layer and the second single crystal silicon layer being positioned on the insulator.

14 Claims, 7 Drawing Sheets

SEMICONDUCTOR SUBSTRATE, METHOD OF MANUFACTURING THE SAME, SEMICONDUCTOR DEVICE, AND METHOD OF MANUFACTURING THE SAME

This application is a continuation of Ser. No. 10/439,896, filed May 16, 2003 now U.S. Pat. No. 7,122,864, the entire contents of which are incorporated herein by reference.

CROSS-REFERENCE TO RELATED APPLICATIONS

This application is based upon and claims the benefit of priority from the prior Japanese Patent Application No. 2003-072218, filed Mar. 17, 2003, the entire contents of which are incorporated herein by reference.

BACKGROUND OF THE INVENTION

1. Field of the Invention

The present invention relates to a semiconductor substrate having a partially formed SOI region. In particular, the present invention relates to a semiconductor substrate having a single crystal silicon layer formed by epitaxial growth. In addition, the present invention relates to a semiconductor device including the semiconductor substrate, and methods of manufacturing these semiconductor substrate and device.

2. Description of the Related Art

Recently, demands for semiconductor devices embedding high performance logic circuit and DRAM are greatly growing. In order to meet the demands, the following technique is much required. According to the technique, a DRAM is embedded in a high performance logic circuit using a semiconductor substrate (SOI substrate) having an SOI (Silicon On Insulator) structure. In particular, a SOI-MOSFET having MOSFET formed on the SOI substrate is hopeful as the high performance logic circuit.

However, even if gate voltage is (OFF state) due to a so-called substrate floating effect, parasitic MOSFET and bipolar currents flow, as the leakage current between the source and drain depend on the potential difference between source and drain. Such a phenomenon is a factor of causing the reduction of deterioration in memory cell transistors of DRAMs, that is, portions requiring strict specifications against leakage current. In addition, the threshold value of pair transistors included in a DRAM sense amplifier circuit shifts due to the substrate floating effect; and due to this, the sense margin lowers. Due to this, it is difficult to form a DRAM having the same MOSFET structure as a high performance logic circuit on a general SOI substrate.

The use of a so-called partial SOI substrate having a partial SOI structure has been tried. In a partial SOI structure, a silicon layer is composed of two regions, that is, an SOI region and a non-SOI region. For example, the transistor is formed in the non-SOI region (bulk region), and thereby, it is possible to prevent the substrate floating effect. As described above, the partial SOI substrate is effective in circuits requiring both an SOI region and bulk region, such as DRAM embedded LOGIC and embedded DRAM (eDRAM).

The following method of manufacturing a partial SOI substrate is employed. According to the method, a SOI layer on the SOI substrate and a BOX (Buried Oxide) layer are selectively removed by etching to form a region, and this formed region is again covered with silicon. In addition, the following method is employed. According to the method, oxygen is partially implanted in the silicon substrate, and an isolation oxide film is formed only in the implanted region. However, according to the methods described above, if the bulk region adjacent to the SOI region is contaminated with heavy metals, the gettering ability of the SOI region is not sufficient. For this reason, it is difficult to stably obtain a stable yield. A so-called bonding method is employed other than these methods described above. According to the bonding method, an oxide film is formed on part of the silicon substrate, and silicon is deposited on the oxide film. Thereafter, the formed silicon substrate and another silicon substrate are bonded together so that a partial SOI structure can be made. The bonding method will be briefly described below with reference to FIG. 7A to FIG. 7F, FIG. 8A and FIG. 8B.

As illustrated in FIG. 7A, a multi-layer comprising a non-single crystal silicon film 102, single crystal silicon film 103 and silicon oxide film ($SiO_2$ film) 104 is formed on one main surface of a silicon substrate 101. As shown in FIG. 7B, the $SiO_2$ film 104 is partially removed so that the surface of the single crystal silicon film 103 can be partially exposed. As seen from FIG. 7C, a silicon film 105 is deposited on the single crystal silicon film 103 and the $SiO_2$ film 104 by epitaxial growth. In this case, the silicon film 105 is formed while being divided into two kinds of layer, due to the difference of the material quality of the front end (seed layer). Most of the silicon film 105a on the single crystal silicon film 103 is formed as a single crystal silicon film (layer) 105a. On the contrary, a silicon film 105b on the $SiO_2$ film 104 is formed as a polycrystalline silicon film (layer) 105b. The single crystal silicon film 105a is deposited on the single crystal silicon film 103 while being integrated with the single crystal silicon film 103.

As shown in FIG. 7D, the surface of the single crystal silicon film 105a and the polycrystalline silicon film 105b is planarized. Thereafter, another silicon substrate 106 used as a support substrate (base wafer) is bonded onto the surface of the films 105a and 105b. The silicon substrate 106 is formed of single crystal silicon, and integrated with the single crystal silicon film 105a. As illustrated in FIG. 7E, the silicon substrate 101 is cut off in the non-single crystal silicon film 102. Thereafter, an active layer side silicon film (single crystal silicon film 103) formed with semiconductor devices (not shown) is made thin. As seen from FIG. 7F, the non-single crystal silicon film 102 is polished and removed. Thereafter, predetermined surface processing, such as planarization, is subjected to the surface of the single crystal silicon film 103. The process described above is carried out, and thereby, a partial SOI substrate 107 having a partial SOI structure is manufactured.

In the partial SOI substrate 107, the polycrystalline silicon film (non-single crystal-silicon film) 105b adjacent to the single crystal silicon film 105a functions as a gettering site. Thus, a high yield can be stably obtained. However, the polycrystalline silicon film 105b has a growth rate higher than the single crystal silicon film 105a. For this reason, the interface between the single crystal silicon film 105a and the polycrystalline silicon film 105b is inclined to the single crystal silicon film 105a side, as shown in FIG. 7C. As a result, as seen from FIG. 8A, in the non-SOI region (bulk region), an element formable region having a sufficient film thickness (depth) for forming buried semiconductor elements decreases. In addition, the decreased amount increases while the required thickness becomes gradually thick, as seen from FIG. 8B. For example, the element formable region is formed thicker in order to form devices such as memory trench cells extending in the depth direction. In this case, there is a high possibility that the element crosses the interface (epi/sub surface) between the single crystal silicon film 105a and the polycrystalline silicon film 105b.

As described above, it is difficult to form the semiconductor elements such as DRAM on the general SOI substrate having the possibility of causing substrate floating effect. In addition, the method of forming the partial SOI structure having the following SOI region using epitaxial growth is not still established. The SOI region has gettering ability sufficient to adjacent bulk region, and has no possibility of reducing the bulk region (element formable region).

BRIEF SUMMARY OF THE INVENTION

According to an aspect of the invention, there is provided a semiconductor substrate comprising: a first single crystal silicon layer; an insulator formed to partially cover one main surface of the first single crystal silicon layer; a second single crystal silicon layer formed to cover a region of the first single crystal silicon layer which is not covered with the insulator, and to cover an edge portion of the insulator adjacent to the region; and a non-single crystal silicon layer formed on the insulator, the interface between the non-single crystal silicon layer and the second single crystal silicon layer being positioned on the insulator.

According to another aspect of the invention, there is provided a method of manufacturing a semiconductor substrate comprising: forming an insulator to partially cover one main surface of a first single crystal silicon layer; epitaxially growing a second single crystal silicon layer on an exposed surface of the first single crystal silicon layer which is not covered with the insulator, to cover an edge portion of the insulator adjacent to the exposed surface; and forming a non-single crystal silicon layer on an exposed surface of the insulator with an end of an interface between the insulator and the non-single crystal silicon layer kept away from an end of the insulator by a predetermined distance, while further epitaxially growing the second single crystal silicon layer.

According to another aspect of the invention, there is provided a method of manufacturing a semiconductor substrate comprising: forming an insulator to partially cover one main surface of a first single crystal silicon layer; forming an amorphous silicon layer to cover a surface of the insulator and an exposed surface of the first single crystal silicon layer which is not covered with the insulator; and heating the amorphous silicon layer. until the amorphous silicon layer on the exposed surface of the first single crystal silicon layer which is not covered with the insulator, is modified into a second single crystal silicon layer by selectively and solid-phase epitaxially growing, using the first single crystal silicon layer as a seed layer.

According to further aspect of the invention, there is provided a semiconductor device comprising: a semiconductor substrate; the semiconductor substrate including: a first single crystal silicon layer; an insulator formed to partially cover one main surface of the first single crystal silicon layer; a second single crystal silicon layer formed to cover a region of the first single crystal silicon layer which is not covered with the insulator, and to cover an edge portion of the insulator adjacent to the region; and a non-single crystal silicon layer formed on the insulator, the interface between the non-single crystal silicon layer and the second single crystal silicon layer being positioned on the insulator; a first semiconductor element formed on an surface of the first single crystal silicon layer or in a range from the surface to a predetermined inside position of the first single crystal silicon layer, at a position off the insulator of the semiconductor substrate; and a second semi-conductor element formed in a range from the surface of the first single crystal silicon layer to at least inside of the second single crystal silicon layer, at a position off the insulator of the semiconductor substrate.

According to further aspect of the invention, there is provided a semiconductor device comprising: a semiconductor substrate; the semiconductor substrate manufactured by; forming an insulator to partially cover one main surface of a first single crystal silicon layer; epitaxially growing a second single crystal silicon layer on an exposed surface of the first single crystal silicon layer which is not covered with the insulator, to cover an edge portion of the insulator adjacent to the exposed surface; and forming a non-single crystal silicon layer on an exposed surface of the insulator while further epitaxially growing the second single crystal silicon layer; a first semiconductor element formed on an surface of the first single crystal silicon layer or in a range from the surface to a predetermined inside position of the first single crystal silicon layer, at a position off the insulator of the semiconductor substrate; and a second semiconductor element formed in a range from the surface of the first single crystal silicon layer to at least inside of the second single crystal silicon layer, at a position off the insulator of the semi-conductor substrate.

According to further aspect of the invention, there is provided a semiconductor device comprising: a semiconductor substrate; the semiconductor substrate manufactured by; forming an insulator to partially cover one main surface of a first single crystal silicon layer; forming an amorphous silicon layer to cover a surface of the insulator and an exposed surface of the first single crystal silicon layer which is not covered with the insulator; and heating the amorphous silicon layer until the amorphous silicon layer on the exposed surface of the first single crystal silicon layer which is not covered with the insulator, is modified into a second single crystal silicon layer by selectively and solid-phase epitaxially growing, using the first single crystal silicon layer as a seed layer; a first semiconductor element formed on an surface of the first single crystal silicon layer or in a range from the surface to a predetermined inside position of the first single crystal silicon layer, at a position off the insulator of the semiconductor substrate; and a second semiconductor element formed in a range from the surface of the first single crystal silicon layer to at least inside of the second single crystal silicon layer, at a position off the insulator of the semi-conductor substrate.

According to yet another aspect of the invention, there is provided a method of manufacturing a semiconductor device comprising: manufacturing a semiconductor substrate; the semiconductor substrate including; a first single crystal silicon layer; an insulator formed to partially cover one main surface of the first single crystal silicon layer; a second single crystal silicon layer formed to cover a region of the first single crystal silicon layer which is not covered with the insulator, and to cover an edge portion of the insulator adjacent to the region; and a non-single crystal silicon layer formed on the insulator, the interface between the non-single crystal silicon layer and the second single crystal silicon layer being positioned on the insulator; forming a first semiconductor element on an surface of the first single crystal silicon layer or in a range from the surface to a predetermined inside position of the first single crystal silicon layer, at a position off the insulator of the semiconductor substrate; and forming a second semiconductor element in a range from a surface of the first single crystal silicon layer to at least inside of the second single crystal silicon layer, at a position off the insulator of the semiconductor substrate.

According to yet another aspect of the invention, there is provided a method of manufacturing a semiconductor device comprising: manufacturing a semiconductor substrate; the semiconductor substrate including; forming an insulator to partially cover one main surface of a first single crystal silicon layer; epitaxially growing a second single crystal silicon layer on an exposed surface of the first single crystal silicon layer which is not covered with the insulator, to cover an edge portion of the insulator adjacent to the exposed surface; and forming a non-single crystal silicon layer on an exposed surface of the insulator while further epitaxially growing the second single crystal silicon layer; forming a first semiconductor element on an surface of the first single crystal silicon layer or in a range from the surface to a predetermined inside position of the first single crystal silicon layer, at a position off the insulator of the semiconductor substrate; and forming a second semiconductor element in a range from a surface of the first single crystal silicon layer to at least inside of the second single crystal silicon layer, at a position off the insulator of the semiconductor substrate.

According to yet another aspect of the invention, there is provided a method of manufacturing a semiconductor device comprising: manufacturing a semiconductor substrate; the semiconductor substrate including; forming an insulator to partially cover one main surface of a first single crystal silicon layer; forming an amorphous silicon layer to cover a surface of the insulator and an exposed surface of the first single crystal silicon layer which is not covered with the insulator; and heating the amorphous silicon layer until the amorphous silicon layer on the exposed surface of the first single crystal silicon layer which is not covered with the insulator, is modified into a second single crystal silicon layer by selectively and solid-phase epitaxially growing, using the first single crystal silicon layer as a seed layer; forming a first semiconductor element on an surface of the first single crystal silicon layer or in a range from the surface to a predetermined inside position of the first single crystal silicon layer, at a position off the insulator of the semiconductor substrate; and forming a second semiconductor element in a range from a surface of the first single crystal silicon layer to at least inside of the second single crystal silicon layer, at a position off the insulator of the semiconductor substrate.

DETAILED DESCRIPTION OF THE INVENTION

Embodiments of the present invention will be described below with reference to the accompanying drawings.

FIRST EMBODIMENT

The first embodiment of the present invention will be described with reference to FIG. 1A to FIG. 1E, FIG. 2A to FIG. 2C, and FIG. 3. FIG. 1A to FIG. 1E and FIG. 2A to FIG. 2C are process sectional views showing a method of manufacturing a semiconductor substrate according to the first embodiment. FIG. 3 is a cross-sectional view showing a semiconductor device according to the first embodiment.

The first embodiment relates to a semiconductor substrate and the method of manufacturing the same. In particular, the first embodiment relates to improvement in the method of manufacturing a partial SOI substrate using a so-called bonding process and epitaxial growth. More specifically, a partial SOI substrate having the following partial SOI structure is manufactured by a bonding process and two-stage epitaxial growth. According to the partial SOI structure, a non-single crystal silicon layer in a SOI region does not intrude into a non-SOI region adjacent to the SOI region.

Figure 1A:
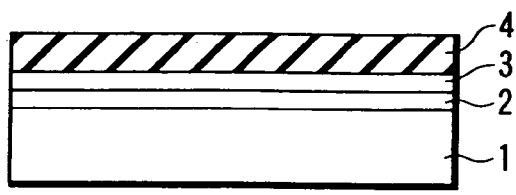
FIG. 1A to FIG. 1E are process sectional views showing a method of manufacturing a semiconductor substrate according to a first embodiment.

As illustrated in FIG. 1A, a porous silicon layer 2 is formed on the surface of a first silicon substrate 1 comprising single crystal silicon by anode formation process. The first silicon substrate 1 formed with the porous silicon layer 2 is annealed under hydrogen atmosphere so that the surface layer of the porous silicon layer 2 can be single-crystallized. By doing so, a first single crystal silicon layer 3 is formed on the first silicon substrate 1. The first single crystal silicon layer 3 is formed using the first silicon substrate 1 as a seed layer by epitaxial growth. A thermal oxidation film 4 is formed on one main surface of the first single crystal silicon layer (first epitaxial silicon layer) 3 until it has a film thickness of about 0.2 μm. More specifically, the thermal oxidation film 4 is, a silicon oxide film ($SiO_2$ film). The $SiO_2$ film 4 calls buried insulator or buried oxide film (BOX layer: Buried Oxide layer).

Figure 1B:
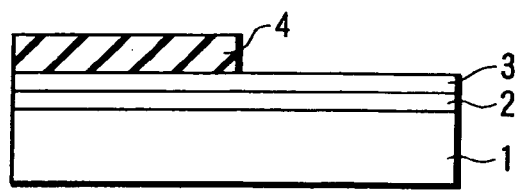

As shown in FIG. 1B, of the $SiO_2$ film 4 formed on the surface of the first single crystal silicon layer 3, the $SiO_2$ film 4 equivalent to a non-SOI region described later is partially removed by normal patterning and etching. By doing so, the surface of a portion of the first single crystal silicon layer 3 included in the non-SOI region is temporarily exposed. The region where the $SiO_2$ film 4 remains becomes a SOI region described later. In the remained $SiO_2$ film 4, the surface of the first single crystal silicon layer 3 is subjected to predetermined masking (patterning). Therefore, the remained $SiO_2$ film 4 functions as a mask (oxide film mask) in the process of forming a second single crystal silicon layer 5 described next.

Figure 1C:
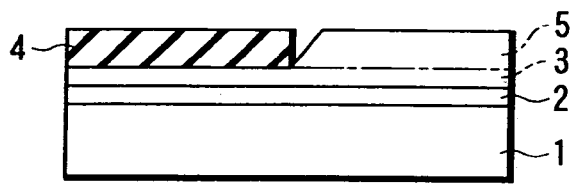

As seen from FIG. 1C, the second single crystal silicon layer 5 is formed to cover the exposed surface of the first single crystal silicon layer 3 except the $SiO_2$ film 4. The first silicon substrate 1 having the partially removed $SiO_2$ film 4 is subjected to hydrogen cleaning at the temperature of about 1000° C. By doing so, native oxide (not shown) formed on the exposed surface of the first single crystal silicon layer 3 is removed. The first silicon substrate 1 removing the native oxide is housed into a chamber (not shown). The internal pressure of the chamber is set to about 10 Torr while the first silicon substrate 1 is heated until the substrate temperature becomes 1000° C. Thereafter, material gas containing dichloro-silane (DCS) and hydrochloric acid (HCl) is supplied to the exposed surface of the first single crystal silicon layer 3 and the surface of the $SiO_2$ film 4. In this case, the DSC gas flow rate is set to about 0.25 slm. The HCl gas flow rate is set to 0.1 slm.

When treatment (deposition) is carried out under the conditions described above, at the beginning of the treatment, single crystal silicon is selectively deposited without depositing the single crystal silicon on the surface of the oxide mask 4. In this case, the single crystal silicon is deposited only on the region of the first single crystal silicon layer 3 that is not covered with the oxide mask 4. That is, at the beginning of the treatment, the second single crystal silicon layer 5 is epitaxially grown on only exposed surface of the first single crystal silicon layer 3. In this case, the second single crystal silicon layer (second epitaxial silicon layer) 5 uses the first single crystal silicon layer 3 as a seed layer. Further, the second single crystal silicon layer 5 epitaxially grows while being integrated with the first single crystal silicon layer 3. As described above, the material gas containing chlorine (Cl) is used. By doing so, the second single crystal silicon layer 5 can be selectively and epitaxially grown in accordance with the material quality of the front end.

Figure 1D:
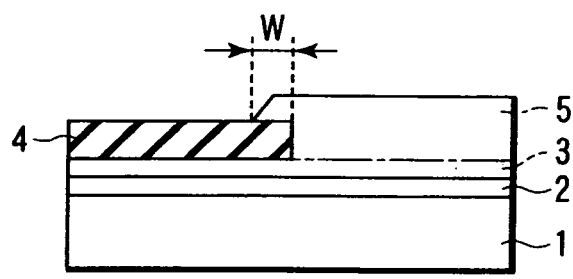

When the treatment is continued, the second single crystal silicon layer 5 grows to the same height (thickness) as the oxide mask 4. With extending a deposition time more, and thereby, the second single crystal silicon layer 5 grows to ride on the surface of the edge portion of the oxide mask 4, as seen from FIG. 1D. Namely, the second single crystal silicon layer 5 is formed on the exposed surface of the first single crystal silicon layer 3 except the oxide mask 4 to cover the edge portion of the oxide mask 4 adjacent to the exposed surface. In the embodiment, the second single crystal silicon layer 5 is formed on the exposed surface of the first single crystal silicon layer 3 and the surface of the edge portion of the oxide mask 4. In this case, the second single crystal silicon layer 5 is formed until the film thickness on the first single crystal silicon layer 3 becomes about 0.4 μm. In FIG. 1D, the width W of the second single crystal silicon layer 5 riding on the oxide mask 4 is about 0.18 μm.

Figure 1E:
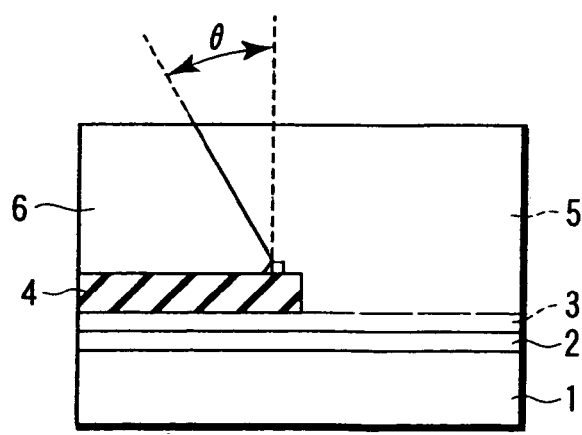

As shown in FIG. 1E, a non-single crystal silicon layer 6 is formed on the exposed surface of the oxide mask 4 covered with no second single crystal silicon layer 5, while epitaxially growing the second single crystal silicon layer 5. This process will be described below in detail.

The substrate temperature (deposition temperature) of the first silicon substrate 1 formed with the second single crystal silicon layer 5 is reduced from about 1000° C. to 700° C. Simultaneously, the material gas supplied into the chamber is changed from material gas containing Cl to material gas containing no Cl. More specifically, $SiH_4$,gas is supplied into the chamber. When deposition is carried out under the conditions described above, the second single crystal silicon layer 5 continues to epitaxially grow, as illustrated in FIG. 1E. In this case, the second single crystal silicon layer 5 grows entirely above the first single crystal silicon layer 3 regardless of the presence of the oxide mask 4. Simultaneously, a non-single crystal silicon layer 6 is deposited on the exposed surface of the oxide mask 4 except the second single crystal silicon layer 5. The non-single crystal silicon layer 6 grows using the oxide mask 4 as the front-end layer, and thereby, is formed as a polycrystalline silicon layer. As described above, the material gas containing no chlorine (Cl) is used. By doing so, the second single crystal silicon layer 5 and the polycrystalline silicon layer 6 can be-concurrently formed in accordance with the material quality of the front-end layer.

In general, many steps exist in the growth surface of the polycrystalline silicon layer 6 as compared with that of the single crystal silicon layer 5, and adsorption probability of silicon atoms is high. Thus, the polycrystalline silicon layer has a higher growth speed than the single crystal silicon layer under the same deposition condition. For example, the single crystal silicon layer and the polycrystalline silicon layer are formed from the same height under the same deposition condition. In this case, as the deposition process advances, the polycrystalline silicon layer grows so as to cover the single crystal silicon layer, although not illustrated. Namely, the single crystal and polycrystalline silicon layers concurrently grow so that the interface between these silicon layers can be inclined to the single crystal silicon layer side.

As a result, according to the conventional method of manufacturing the partial SOI substrate (partial SOI structure), the polycrystalline silicon layer in the SOI region intrudes into the non-SOI region. For this reason, the element formable region in the non-SOI region (bulk region) decreases. In particular, the element formable region having sufficient film thickness (depth) for forming buried semiconductor elements, such as memory trench cell, extending in the depth direction, decreases. The decrease amount increases the thicker the required film. If the buried semiconductor element is formed in the element formable region into which the polycrystalline silicon layer intrudes, there is high possibility as described below. That is, the semiconductor element crosses the interface between the single crystal silicon layer and the polycrystalline silicon layer. If the semi-conductor element crosses the interface between the silicon layers described above, the semiconductor element cannot function normally. In addition, a semiconductor device provided in a state that the semiconductor element crosses the interface between the silicon layers is hard to normally function. The yield of the semiconductor device is reduced.

On the contrary, in the embodiment, the second single crystal silicon layer 5 is previously formed as described before. In this case, the second single crystal silicon layer 5 is formed to cover the surface of the first single crystal silicon layer and the edge portion of the oxide mask 4 adjacent to there. By doing so, the deposition of the second single crystal silicon layer 5 and the polycrystalline silicon layer 6 starts. In this case, portions of the second single crystal silicon layer 5, which are not formed on the oxide mask 4, mainly grow epitaxially. Simultaneously, the polycrystalline silicon layer 6 is deposited on the exposed surface of the oxide mask 4 and the surface of the second single crystal silicon layer 5 on the edge portion of the oxide mask 4. As described before, the polycrystalline silicon layer 6 has a higher growth speed than the second single crystal silicon layer 5. Nevertheless, when the deposition process is continued, the second single crystal silicon layer 5 on the oxide mask 4 epitaxially grows to cover the polycrystalline silicon layer 6. Under the foregoing deposition condition, the growth speed of the second single crystal silicon layer 5 is about 0.25 μm/min. On the contrary, the growth speed of the polycrystalline silicon layer 6 is about 0.25 μm/min.

Thereafter, when the deposition process is continued, the single crystal and polycrystalline silicon layers 5 and 6 concurrently grow so that the interface between these silicon layers 5 and 6 can be inclined to the single crystal silicon layer side. In the embodiment, the deposition process is continued for two minutes until the surfaces of the single crystal and polycrystalline silicon layers 5 and 6 reach approximately the same height. By doing so, the first silicon substrate 1 can be formed with the second single crystal silicon-layer 5 and the polycrystalline silicon layer 6, which have almost no surface step.

Then, the surfaces of the second single crystal silicon layer 5 and the polycrystalline silicon layers 6 reach approximately the same height. At this time, the interface between the silicon layers 5 and 6, that is, an inclination angle θ of the interface shown in FIG. 1E is about 30°. Namely, the interface between the silicon layers 5 and 6 is inclined at an angle of about 30° toward the oxide mask 4 from the normal direction of the oxide mask 4 (first silicon substrate 1). Of course, the interface between the second single crystal and polycrystalline silicon layers 5 and 6 exists on the oxide mask 4.

Figure 2A:
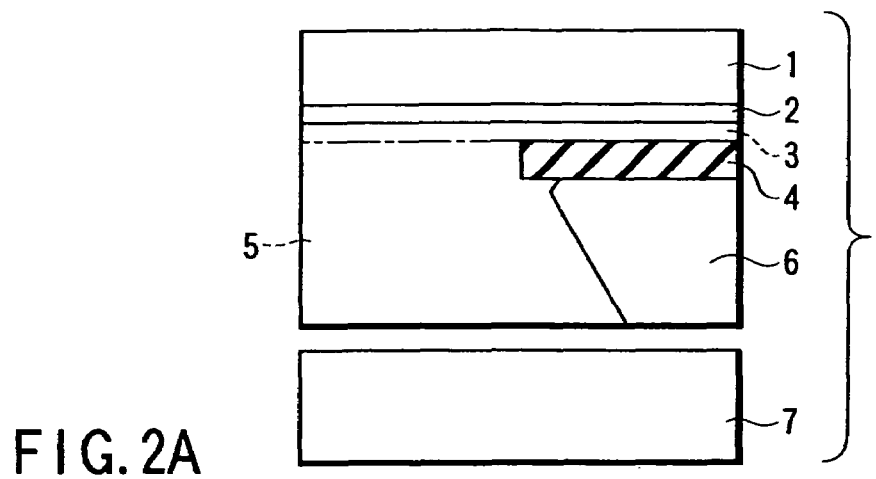
FIG. 2A to FIG. 2C are process sectional views. showing a method of manufacturing a semiconductor substrate according to a first embodiment.
Figure 2B:
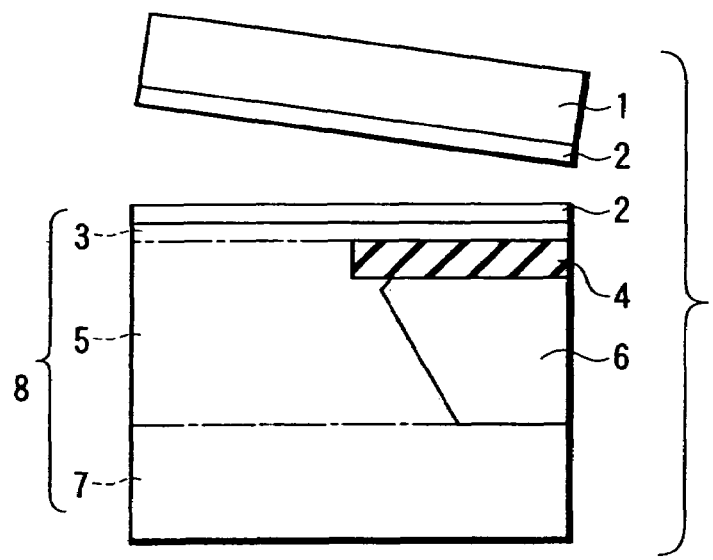
Figure 2B:
Figure 3:
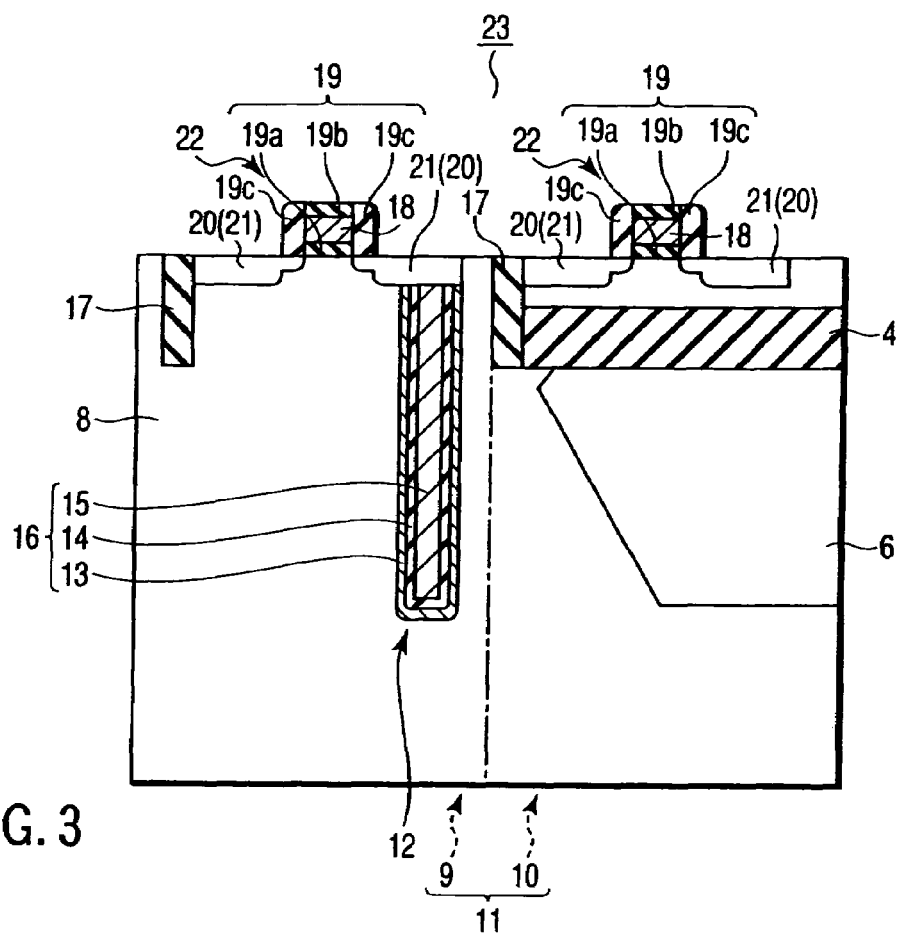
FIG. 3 is a cross-sectional view showing a semiconductor device according to a first embodiment.

As depicted in FIG. 2A, a third single crystal silicon layer 7 is bonded to the surfaces of the second single crystal silicon layer 5 and the polycrystalline silicon layers 6. More specifically, second silicon substrate 7 comprising single crystal silicon is bonded to the surface of the silicon layer 6. The second silicon substrate 7 is called a support substrate, or handling wafer. The third single crystal silicon layer 7 bonded to the surfaces of the second single crystal silicon layer 5 and the polycrystalline silicon layers 6 is integrated with the second single crystal silicon layer 5. As illustrated in FIG. 2B, the first to third single crystal silicon layers 3, 5 and 7 are integrated into one single silicon layer 8.

If the height of the surface of the second single crystal silicon layer 5 has no coincidence with that of the polycrystalline silicon layers 6, it is difficult to accurately bond the second silicon substrate 7 on the surfaces of these silicon layers. In this case, the surfaces of the second single crystal silicon layer 5 and the polycrystalline silicon layers 6 are planarized before the third single crystal silicon layer 7 is bonded to their surfaces. For example, the surfaces of the second single crystal silicon layer 5 and the polycrystalline silicon layers 6 are subjected to CMP so that they can be adjusted to the same height.

Figure 2C:
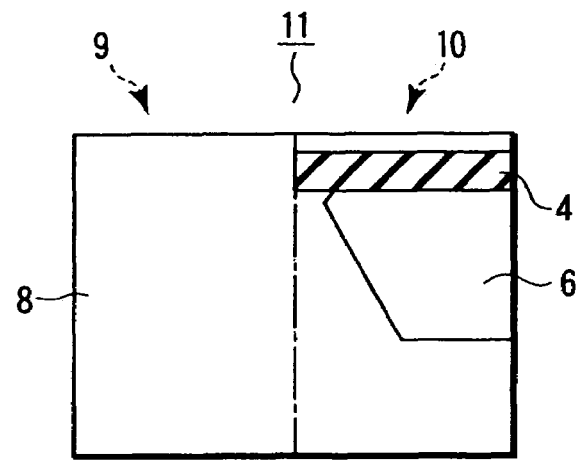
Figure 2C:

As seen from FIG. 2B and FIG. 2C, the active silicon layer comprising the first silicon substrate, porous silicon layer 2 and first single crystal layer 3 is made thin. According to the embodiment, in order to make thin the active silicon layer, a so-called ELTRAN (Epitaxial Transfer) process is used because of readily controlling the thickness of the silicon layer. More specifically, as illustrated in FIG. 2B, the porous layer 2 is cut using a water jet. As shown in FIG. 2C, the porous layer 2 remaining on the surface (backside) of the first single crystal silicon layer 1 is removed by wet etching. By doing so, the active silicon layer is made thin in a state that only the first single crystal silicon layer 3 is left on the active layer side. In addition, the surface of the remaining first single crystal silicon layer 3 is subjected to heat treatment under hydrogen atmosphere. By doing so, the surface of the remaining first single crystal silicon layer 3, that is, the surface of the active silicon layer is planarized, which terminates the manufacturing process of this embodiment.

The processes described above are carried out to obtain a semiconductor substrate (partial SOI substrate) 11 having the desired partial SOI structure. The partial SOI substrate 11 has the single crystal silicon layer 8 comprising first to third single crystal silicon layers 3, 5 and 7, SiO$_2$ film (insulator) 4 and the partial SOI structure having two regions, as seen from FIG. 2C. The partial SOI structure includes a SOI region 10 comprising the polycrystalline silicon layer (non-single crystal silicon layer) 6 and a non-SOI region (bulk region) 9 comprising only single crystal silicon layer 8. The SOI region 10 and the non-SOI region 9 are adjacent to each other.

More specifically, in the partial SOI substrate 11, the SiO$_2$ film 4 is partially formed on the active surface layer of the single crystal silicon layer 8 along the surface of the single crystal silicon layer 8. The polycrystalline silicon layer 6 is formed contacting with the main surface of the SiO$_2$ film 4 opposite to the active surface layer of the single crystal silicon layer 8. Further, the silicon layer 6 is formed only on the main surface of the SiO$_2$ film 4 so the interface with the second single crystal silicon layer 5 can be positioned on there. Namely, in the partial SOI substrate 11, the polycrystalline-silicon layer 6 capable of performing gettering ability to the single crystal silicon layer 8 is formed in only SOI region 10. Thus, the silicon layer 6 does not intrude into the non-SOI region 9. Therefore, the non-SOI region 9 can be entirely used as a good element formable region.

A semiconductor device of the first embodiment and the method of manufacturing the same will be described with reference to FIG. 3. In the semiconductor device of the embodiment and the method of manufacturing the same, the partial SOI substrate is provided with a buried semiconductor element. In this case, the buried semiconductor element is provided securing a sufficient depth so that it can properly function. In addition, the partial SOI substrate is provided with the semiconductor element so as to prevent a substrate floating effect. More specifically, the semiconductor substrate 11 is provided with a semiconductor element.

As illustrated in FIG. 3, a trench 12 is formed in the non-SOI region (bulk region) 9 of the partial SOI substrate 11. In the first embodiment, the trench 12 is formed over the range from the active layer surface of the single crystal silicon layer 8 to the deep part equal to the lowest portion of the polycrystalline silicon layer 6 in the SOI region 10. Using a standard method of manufacturing capacitor elements, an embedded plate electrode 13, capacitor insulating film 14 and storage electrode 15 are formed in the trench 12. By doing so, an embedded semiconductor element, that is, a memory trench cell 16 as a second semiconductor element, is made in the bulk region 9.

Two isolation regions 17 are formed in the bulk region 9. In this case, one isolation region 17 is formed contacting with the SiO$_2$ film 4 at the boundary between the bulk region 9 and the SOI region 10. Well and channel (not shown) are formed in the bulk region 9 and the SOI region 10. A gate 18 and a gate insulator 19 are formed on the active layer surface of the single crystal silicon layer 8. The gate insulator is composed of bottom, upper and side wall portions 19a to 19c. Ions are implanted in the active surface layer of the single crystal silicon layer 8, and thereafter, a thermal diffusion process is carried out so that source and drain 20 (21) can be formed. By doing so, a transistor 22 as a first semiconductor element is made in each of the bulk region 9 and the SOI region 10.

One of the source and drain 20 (21) formed in the bulk region 9 is formed so that it can be electrically connected with the upper end of the memory trench cell 16. The transistor 22 made in the SOI region 10 has specification to substrate floating effect set lighter than the transistor 22 made in the bulk region 9.

The process of manufacturing the semiconductor device of the first embodiment ends. The process described above is carried out, and thereby, a desired semiconductor device 23 can be obtained. Namely, in the semiconductor device 23, the memory trench cell 16 is formed having sufficient depth in the bulk region 9 without crossing the interface between the silicon layers 8 and 6. Therefore, the memory trench cell 16 can secure sufficient capacitance, and properly function. In addition, there is no possibility that deterioration of performance by substrate floating effect occurs in the transistor 22 made in the bulk region 9; therefore, the transistor 22 can properly function. Incidentally, the memory trench cell 16 and transistor 22 formed in the bulk region 9 may be used as the element of a logic circuit (not shown). Likewise, the transistor 22 formed in the SOI region 10 may be used as the element of a DRAM (not shown).

As described above, according to the first embodiment, the SOI region 10 of the partial SOI substrate 11 has gettering ability to the non-SOI region 9 adjacent thereto. In addition, the partial SOI substrate 11 can use the entirety of the non-SOI region 9 as a good element formable region.

In the method of manufacturing the semiconductor substrate according to the embodiment, a two-stage epitaxial growth process is employed when forming the single crystal silicon layer 8 (second single crystal silicon layer 5). The two-stage epitaxial growth process includes a selective epitaxial growth process and entire surface epitaxial growth process. By doing so, the polycrystalline silicon layer 6 in the SOI region 10 and the single crystal silicon layer 5 in the non-SOI region 9 adjacent to there are concurrently formed at individual proper positions. Therefore, according to the method of manufacturing the semiconductor substrate, it is possible to readily manufacture the partial SOI substrate including the foregoing good partial SOI structure using epitaxial growth process.

In the semiconductor device 23 of the embodiment, the transistor 22 formed in the non-SOI region 9 of the partial SOI substrate 11 prevents the occurrence of the substrate floating effect. In addition, the memory trench cell 16 formed in the non-SOI region 9 is formed in a state of securing a depth capable of enabling the capacitor element to function properly. Namely, in the semiconductor device 23, the memory trench cell 16 and the transistor 22 are provided on the partial SOI substrate 11 having a good partial SOI structure in a state to enable proper functioning. Therefore, the semiconductor device 23 has high quality and reliability.

According to the method of manufacturing the semiconductor device of the embodiment, a semiconductor device 23 having high quality and reliability can be readily manufactured at high yield.

SECOND EMBODIMENT

Figure 6:
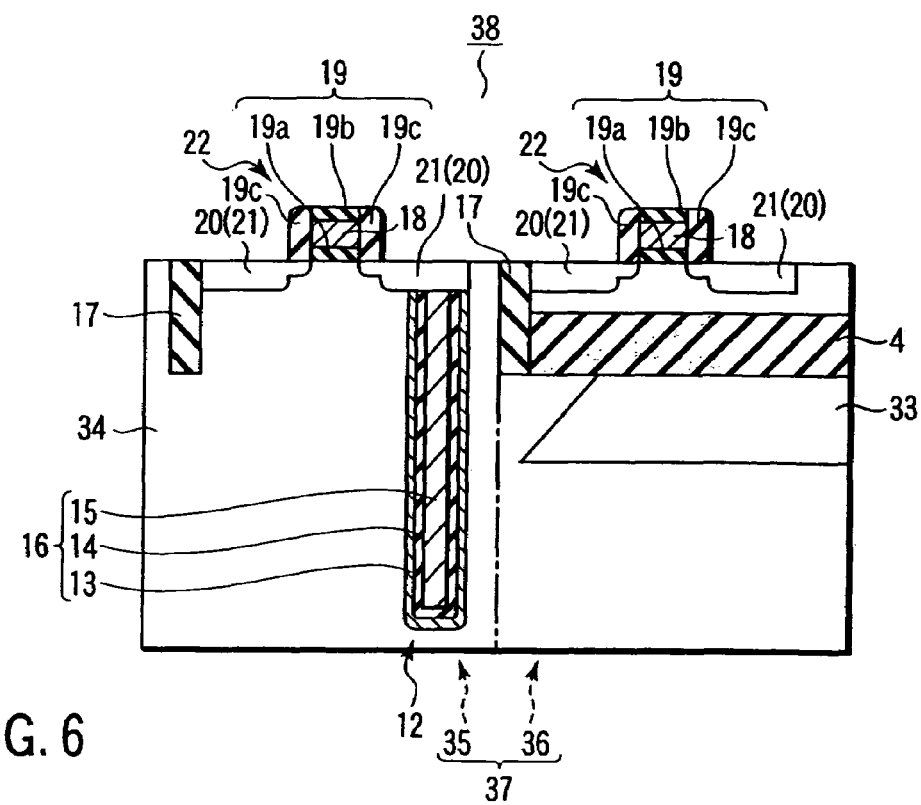
FIG. 6 is a cross-sectional view showing a semiconductor device according to a second embodiment.

The second embodiment of the present invention will be described with reference to FIG. 4A to FIG. 4E, FIG. 5A to FIG. 5D, and FIG. 6. FIG. 4A to FIG. 4E and FIG. 5A to FIG. 5D are process sectional views showing a method of manufacturing a semiconductor substrate according to the second embodiment. FIG. 6 is a cross-sectional view showing a semiconductor device according to the second embodiment. The same reference numerals are used to designate the portions identical to the first embodiment, and the details are omitted.

The semiconductor substrate according to the second embodiment and the method of manufacturing 'the same will be described with reference to FIG. 4A to FIG. 4E and FIG. 5A to FIG. 5D. In the semiconductor substrate of the embodiment and the method of manufacturing the same, a partial SOI substrate having partial SOI structure is manufactured using a so-called bonding process and solid phase epitaxial growth. In the partial SOI structure, the non-single crystal silicon layer in the SOI region does not intrude into the non-SOI region adjacent to the SOI region.

Figure 4A:
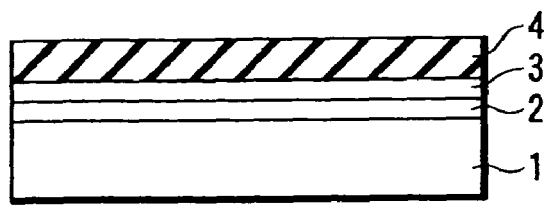
FIG. 4A to FIG. 4E are process sectional views showing a method of manufacturing a semiconductor substrate according to a second embodiment.

As illustrated in FIG. 4A, the first silicon substrate 1 is provided with the following multi-layer according to the same method as the first embodiment. The multi-layer comprises the porous silicon layer 2, first single crystal silicon layer 3 and the SiO$_2$ film 4 having the thickness of about 0.2 μm.

Figure 4B:
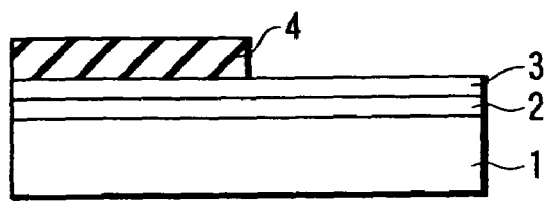

As depicted in FIG. 4B, according to the same method as the first embodiment, the SiO$_2$ film 4 equivalent to the region used as the non-SOI region described later is removed. In this case, the SiO$_2$ film 4 is-removed so that it remains in only region used as the SOI region described later.

Figure 4C:
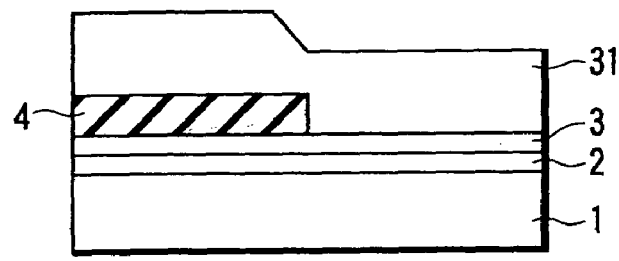

As seen from FIG. 4C, an amorphous silicon layer 31 is formed over the exposed surface of the first single crystal silicon layer 3 and the surface of the SiO$_2$ film 4. More specifically, the first silicon substrate 1 is heated until the substrate temperature becomes about 500° C. Thereafter, SiH$_4$ gas is supplied to the exposed surface of the first single crystal silicon layer 3 and the surface of the SiO$_2$ film 4. By doing so, the amorphous silicon layer 31 is formed over the exposed surface of the first single crystal silicon layer 3 and the surface of the SiO$_2$ film 4 until the film thickness becomes about 0.4 μm.

Figure 4D:
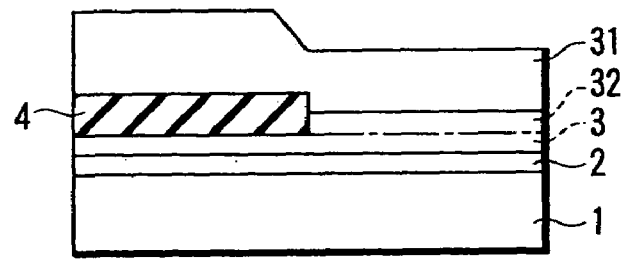

As shown in FIG. 4D, the amorphous silicon layer 31 above the first single crystal silicon layer 3, which is not covered with the SiO$_2$ film 4, is single-crystallized. The following is a detailed description.

The substrate temperature of the first silicon substrate formed with the amorphous silicon layer 31 is increased from about 500° C. to about 900° C. so that the amorphous silicon layer 31 can be heated. The amorphous silicon layer 31 above the first single crystal silicon layer 3 except the SiO$_2$ film 4 solid-phase epitaxially grows using the first single crystal layer 3 as the seed layer. Thus, the amorphous silicon layer 31 is modified into a second single crystal silicon layer 32. The second single crystal silicon layer 32 solid-phase epitaxially grows while being integrated with the first single crystal silicon layer 3. In this case, the amorphous silicon layer 31 above the SiO$_2$ film 4 solid-phase epitaxially grows using the SiO$_2$ film 4 as the front-end layer. Thus, the amorphous silicon layer 31 is modified into a polycrystalline silicon layer 33.

Figure 4E:
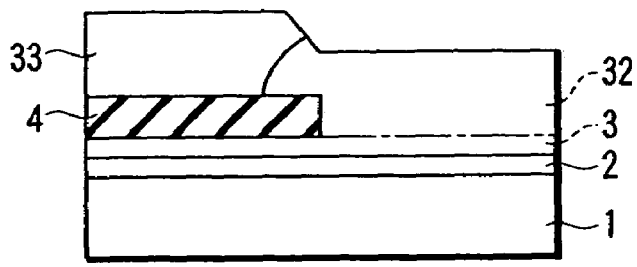

The second single crystal silicon layer 32 grows along the thickness direction of the amorphous silicon layer 31. Thus, the amorphous silicon layer 31 above the first single crystal silicon layer 3 except the SiO$_2$ film 4 is all modified into the second single crystal silicon layer 32. After the second single crystal silicon layer 32 reaches the surface of the amorphous silicon layer 31, heating is further continued. By doing so, the amorphous silicon layer 31 on the SiO$_2$ film 4 starts to be single-crystallized. Thus, the second single crystal silicon layer 32 grows to ride on the surface of the edge portion of the SiO$_2$ film 4, as illustrated in FIG. 4E. In the embodiment, heating to the amorphous silicon layer 31 is continued until the interface between the silicon layers 32 and 33 reaches above the SiO$_2$ film 4.

Figure 5A:
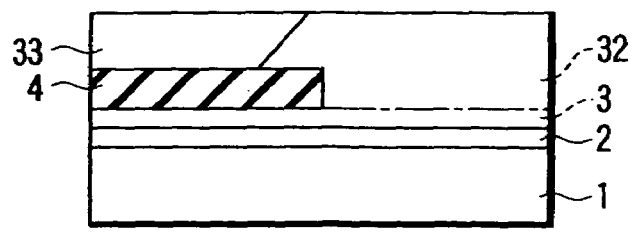
FIG. 5A to FIG. 5D are process sectional views showing a method of manufacturing a semiconductor substrate according to a second embodiment.

As illustrated in FIG. 5A, the surfaces of the second single crystal silicon layer 32 and the polycrystalline silicon layer 33 are subjected to CMP process so that their surfaces can be planarized. By doing so, the surfaces of the second single crystal silicon layer 32 and the polycrystalline silicon layer 33 are adjusted to approximately equal height.

Figure 5B:
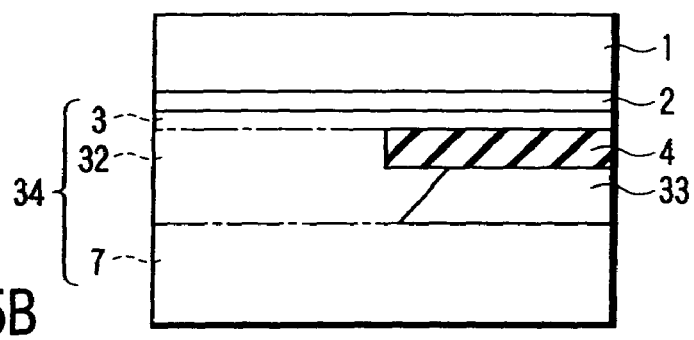

As shown in FIG. 5B, the second silicon substrate (third single crystal silicon layer) 7 is bonded to the surfaces of the silicon layers 32 and 33 according to the same method as the first embodiment. The bonded third single crystal silicon layer 7 is integrated with the second single crystal silicon layer 32. As seen from FIG. 5C, the first to third single crystal silicon layers 3, 32 and 7 are integrated to form one single crystal silicon layer 34.

Figure 5C:
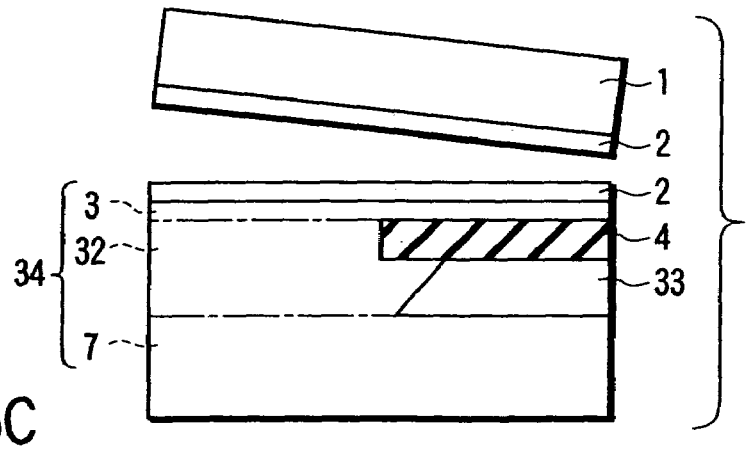
Figure 5D:
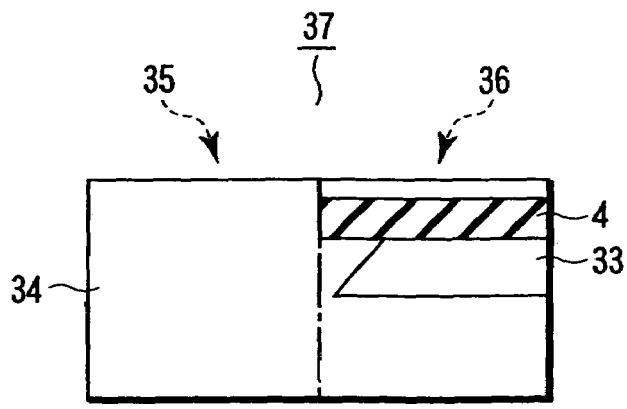
Figure 7A:
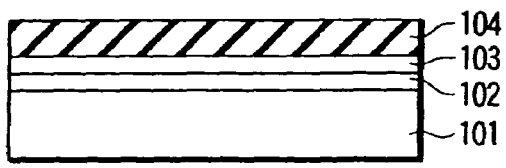
FIG. 7A to FIG. 7F are process sectional views showing a method of manufacturing a semiconductor substrate according to a conventional technique.
Figure 7B:
Figure 7C:
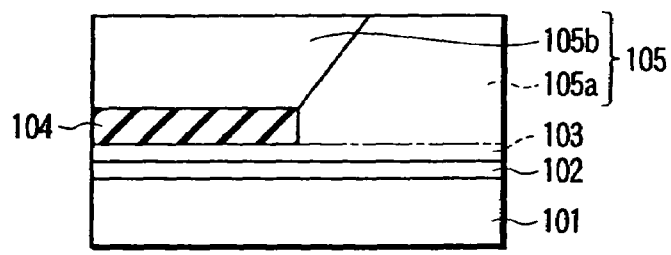
Figure 7D:
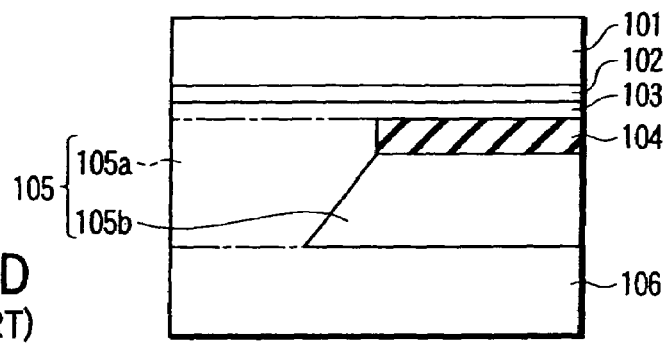
Figure 7E:
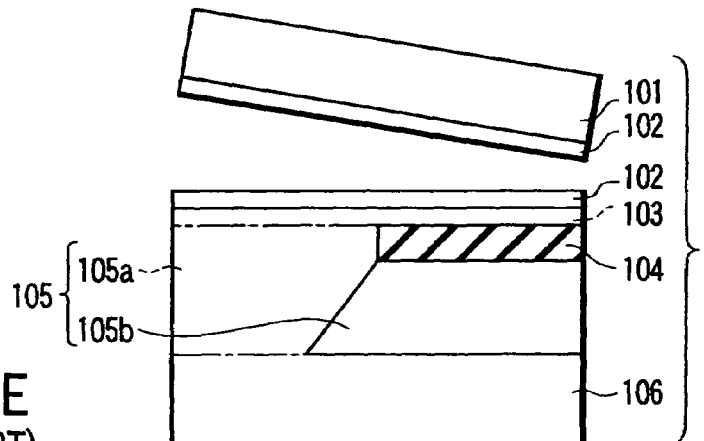
Figure 7F:
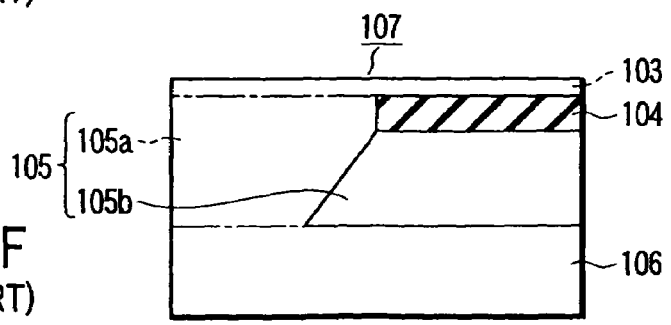
Figure 8A:
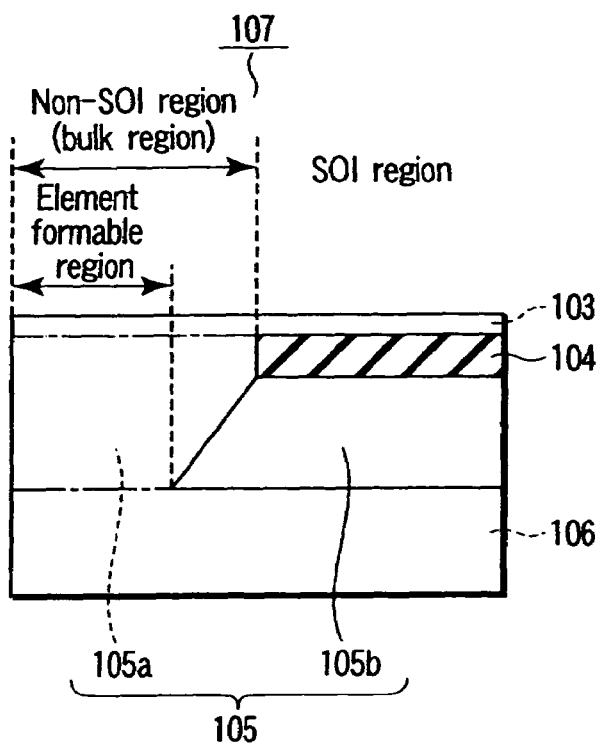
FIG. 8A and FIG. 8B are cross-sectional views showing a method of manufacturing the semiconductor substrate according to the conventional technique.
Figure 8B:
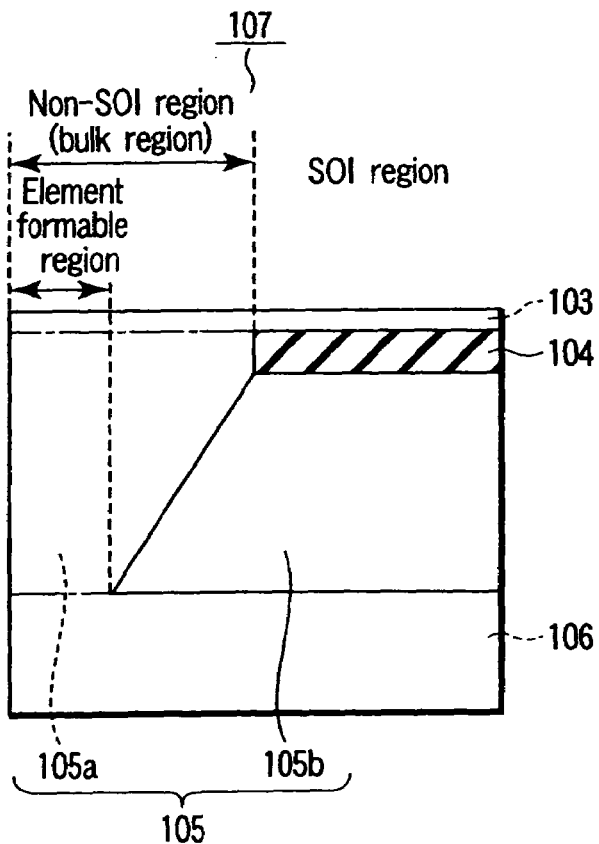

As shown in FIG. 5C and FIG. 5D, the active silicon layer is made thin according to the same method as the first embodiment, and thereafter, the surface is planarized. This ends the process of manufacturing the semiconductor substrate of the second embodiment.

The process described above is carried out, and thereby, a semiconductor substrate (partial SOI substrate) 37 having the desired partial SOI structure can be obtained. The partial SOI substrate 37 has the single crystal silicon layer 34 comprising first to third single crystal silicon layers 3, 32 and 7, $SiO_2$ film (insulator) 4 and the partial SOI structure having two regions, as seen from FIG. 5D. The partial SOI structure includes a SOI region 36 comprising the polycrystalline silicon layer (non-single crystal silicon layer) 33 and a non-SOI region (bulk region) 35 comprising only single crystal silicon layer 34. The SOI region 36 and the non-SOI region 35 are adjacent to each other. In the partial SOI substrate 37, the polycrystalline silicon layer 33 is formed only on the main surface of the $SiO_2$ film 4 so that the interface between the silicon layers 33 and 32 can be positioned on the main surface thereof. Namely, in the partial SOI substrate 37, the polycrystalline silicon layer 33 capable of performing gettering ability to the single crystal silicon layer 34 is left only in the SOI region 36. Thus, the polycrystalline silicon layer 33 does not remain in the non-SOI region 35 adjacent to the SOI region 36. Therefore, the whole non-SOI region 35 can be used as a good element formable region.

A semiconductor device of the second embodiment and the method of manufacturing the same will be briefly described with reference to FIG. 6. In the semiconductor device of the embodiment and the method of manufacturing the same, the semiconductor substrate 37 is provided with semiconductor elements so the semiconductor elements can properly function.

A semiconductor device 38 and manufacturing method of the second embodiment is different from the semiconductor device 23 and manufacturing method of the first embodiment, in the following point. That is, the partial SOI substrate 37 is used in place of the partial SOI substrate 11. In the semiconductor device 38, the memory trench cell 16 is formed without crossing the interface between the silicon layer 34 and 33. Further, the memory trench cell 16 is formed over the range from the active surface of the silicon layer 34 to the position sufficiently deeper than the lowest portion of the silicon layer 33. By doing so, the memory trench cell 16 can secure a highly sufficient capacitance, and can properly function. Of course, the transistor 22 formed in the non-SOI region 35 prevents the substrate floating effect.

According to the second embodiment, the same effect as the first embodiment can be obtained. In addition, the solid-phase epitaxial growth process is employed. By doing so, single crystal and polycrystalline silicon layers 32 and 33 may be independently formed at proper positions using only one gas source. Therefore, according to the method of manufacturing the semiconductor substrate, it is possible to readily manufacture the partial SOI substrate 37 including the foregoing good partial SOI structure. In this case, the partial SOI structure has gettering ability sufficient to the non SOI region 35 adjacent to the SOI region 36 without making narrow the non-SOI region 35 by the SOI region 36. In addition, the semiconductor device includes the partial SOI structure 37 having good partial SOI structure, and is provided with the memory trench cell 16 and the transistor 22 capable of properly functioning. As a result, it is possible to readily manufacture the semiconductor device having high quality and reliability at high yield.

In the present invention, the semiconductor substrate, the method of manufacturing the same, the semiconductor device, and the method of manufacturing the same are not limited to the first and second embodiments. Various settings of the structure or parts of the process may be made, or various settings may be properly combined within the scope not departing from the spirit of the present invention.

For example, in the first embodiment, the width W and height of the second crystal silicon layer 5 riding on the $SiO_2$ film 4 may be set as follows. The width W and height may be properly set in accordance with the ratio of the growth speed of the silicon layer 5 grown in the next process to that of the polycrystalline silicon layer 6. By doing so, the inclination angle θ of the interface between the silicon layers 5 and 6 can be set to a proper magnitude. In other words, the intrusion (intrusion width) of the second crystal silicon layer 5 into the SOI region 10 can be set to a proper magnitude. Likewise, in the second embodiment, the width W and height of the second crystal silicon layer 32 ridden on the $SiO_2$ film 4 may be set.

In the first embodiment, before the second single crystal silicon layer 5 and the polycrystalline silicon layer 6 are concurrently formed, the second single crystal silicon layer 5 is formed. In this case, the silicon layer 5 is formed to cover the exposed surface of the first single crystal silicon layer 3 except the $SiO_2$ film 4 and the edge portion of the $SiO_2$ film 4 adjacent to the exposed surface. However, the present invention is not limited to the deposition process described above. For example, the second single crystal silicon layer 5 is formed to cover the exposed surface of the first single crystal silicon layer 3 and the entire surface of the $SiO_2$ film 4. The silicon layer 5 on the edge portion of the $SiO_2$ film 4 adjacent to the surface of the silicon layer 3 is removed by predetermined lithography and etching processes. In addition, the second single crystal silicon layer 5 on the $SiO_2$ film 4 is removed. Thereafter, the polycrystalline silicon layer 6 is selectively formed on the $SiO_2$ film 4 in which the second single crystal silicon layer 5 has already been removed. According to the deposition process described above, the partial SOI substrate 11 having the desired partial SOI structure can be obtained like the first embodiment.

In the first and second embodiments, the active silicon layer is made thin using ELTRAN process readily controlling the thickness of the silicon layer. The present invention is not limited to the ELTRAN process. For example, the following process (UNIBOND process) may be employed. According to the UNIBOND process, hydrogen ions are implanted to the active silicon layer, and thereafter, the silicon layer is made thin by heat treatment. In addition, the process may be employed such that the silicon layer is made thin by polishing such as CMP.

In the second embodiment, the surfaces of the second single crystal silicon layer 32 and the polycrystalline silicon layer 33 are planarized so that the height can be adjusted. CMP readily controlling the film thickness is employed as the process described above. However, the present invention is not limited to the CMP process. For example, the same effect can be obtained by wet etching. In addition, thermal oxidation and wet etching may be combined.

In the second embodiment, at least amorphous silicon layer 31 above the single crystal silicon layer 3 except the SiO$_2$ film 4 is single-crystallized. However, the present invention is not limited to the deposition process described above. For instance, the entire amorphous silicon layer 31 formed covering the exposed surface of the silicon layer 3 and the entire surface of the SiO$_2$ film 4 is modified into the second single crystal silicon layer 32 by heating. The second single crystal silicon layer 32 on the edge portion of the SiO$_2$ film 4 adjacent to the exposed surface of the silicon layer 3 is removed by predetermined lithography and etching processes. In addition, the second single crystal silicon layer 32 on the SiO$_2$ film 4 is removed. Thereafter, the polycrystalline silicon layer 33 is selectively formed on the SiO$_2$ film 4 in which the second single crystal silicon layer 32 has already been removed. According to the deposition process described above, the partial SOI substrate 37 having the desired partial SOI structure can be obtained, as in the second embodiment.

In the first and second embodiments, each of non-SOI regions (bulk region) 9 and 35 of the partial SOI substrates 11 and 37 is formed with the memory trench cell 16 and the transistor 22. On the other hand, each of SOI regions 10 and 36 is formed with only transistor 22. The present invention is not limited to the structure described above. For example, the position and number of the memory trench cell 16 and transistor 22 may be properly set in accordance with the desired configuration (structure) of the semiconductor devices 23 and 38. The partial SOI substrates 11 and 37 are provided with memory trench cell 16 and transistor 22 as the semiconductor element. However, the semi-conductor element is not limited to components described above. The partial SOI substrates 11 and 37 may be provided with various semiconductor elements in accordance with the configuration of the-desired semiconductor deices 23 and 38.

Of course, the partial SOI substrates 11 and 37 having good partial SOI structure are applicable to semiconductor devices embedding high-performance logic circuits and DRAMs onto one chip. In particular, the partial SOI substrates 11 and 37 are applicable to SOI-MOSFET forming MOSFET on the SOI substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor substrate comprising:
    forming an insulator to partially cover one main surface of a first single crystal silicon layer;
    epitaxially growing a second single crystal silicon layer on an exposed surface of the first single crystal silicon layer which is not covered with the insulator, to cover an edge portion of the insulator adjacent to the exposed surface; and
    forming a non-single crystal silicon layer on an exposed surface of the insulator with an end of an interface between the insulator and the non-single crystal silicon layer kept away from an end of the insulator by a predetermined distance, while further epitaxially growing the second single crystal silicon layer.

2. A method according to claim 1, wherein material gas containing Cl is used, and thereby, the second single crystal silicon layer is selectively and epitaxially grown mainly on the exposed surface of the first single crystal silicon layer using the first single crystal silicon layer as a seed layer.

3. A method according to claim 1, wherein a polycrystalline silicon layer is formed as the non-single crystal silicon layer.

4. A method according to claim 1, further comprising:
    forming a third single crystal silicon layer to cover the surfaces of the second single crystal silicon layer and the non-single crystal silicon layer.

5. A method according to claim 1, further comprising:
    making thin the first single crystal silicon layer.

6. A method according to claim 1, wherein material gas containing no Cl is used, and thereby, the second single crystal silicon layer is epitaxially grown on the entire surface of the first single crystal silicon layer and the insulator concurrently with the non-single crystal silicon layer.

7. A method of manufacturing a semiconductor substrate comprising:
    forming an insulator to partially cover one main surface of a first single crystal silicon layer;
    forming an amorphous silicon layer to cover a surface of the insulator and an exposed surface of the first single crystal silicon layer which is not covered with the insulator; and
    heating the amorphous silicon layer until the amorphous silicon layer on the exposed surface of the first single crystal silicon layer which is not covered with the insulator, is modified into a second single crystal silicon layer by selectively and solid-phase epitaxially growing, using the first single crystal silicon layer as a seed layer.

8. A method according to claim 7, wherein the amorphous silicon layer which is not modified into the second single crystal silicon layer by the heating, is modified into a polycrystalline silicon layer by the heating.

9. A method according to claim 7, further comprising:
    forming a third single crystal silicon layer to cover a surface of the second single crystal silicon layer modified from the amorphous silicon layer by said heating, and to cover a surface of the amorphous silicon layer which is not modified into the second single crystal silicon layer.

10. A method according to claim 7, further comprising:
    making thin the first single crystal silicon layer.

11. A method according to claim 7, wherein the third single crystal silicon layer is formed integrally with the second single crystal silicon layer by bonding process.

12. A method of manufacturing a semiconductor device comprising:
    manufacturing a semiconductor substrate;
    the semiconductor substrate including;
    a first single crystal silicon layer;
    an insulator formed to partially cover one main surface of the first single crystal silicon layer;
    a second single crystal silicon layer formed to cover a region of the first single crystal silicon layer which is not covered with the insulator, and to cover an edge portion of the insulator adjacent to the region; and
    a non-single crystal silicon layer formed on the insulator, the interface between the non-single crystal silicon layer and the second single crystal silicon layer being positioned on the insulator;

forming a first semiconductor element on an surface of the first single crystal silicon layer or in a range from the surface to a predetermined inside position of the first single crystal silicon layer, at a position off the insulator of the semiconductor substrate; and forming a second semiconductor element in a range from a surface of the first single crystal silicon layer to at least inside of the second single crystal silicon layer, at a position off the insulator of the semiconductor substrate.

13. A method of manufacturing a semiconductor device comprising:

manufacturing a semiconductor substrate;

the semiconductor substrate including;

forming an insulator to partially cover one main surface of a first single crystal silicon layer;

epitaxially growing a second single crystal silicon layer on an exposed surface of the first single crystal silicon layer which is not covered with the insulator, to cover an edge portion of the insulator adjacent to the exposed surface; and forming a non-single crystal silicon layer on an exposed surface of the insulator while further epitaxially growing the second single crystal silicon layer;

forming a first semiconductor element on an surface of the first single crystal silicon layer or in a range from the surface to a predetermined inside position of the first single crystal silicon layer, at a position off the insulator of the semiconductor substrate; and forming a second semiconductor element in a range from a surface of the first single crystal silicon layer to at least inside of the second single crystal silicon layer, at a position off the insulator of the semiconductor substrate.

14. A method of manufacturing a semiconductor device comprising:

manufacturing a semiconductor substrate;

the semiconductor substrate including;

forming an insulator to partially cover one main surface of a first single crystal silicon layer;

forming an amorphous silicon layer to cover a surface of the insulator and an exposed surface of the first single crystal silicon layer which is not covered with the insulator; and heating the amorphous silicon layer until the amorphous silicon layer on the exposed surface of the first single crystal silicon layer which is not covered with the insulator, is modified into a second single crystal silicon layer by selectively and solid-phase epitaxially growing, using the first single crystal silicon layer as a seed layer;

forming a first semiconductor element on an surface of the first single crystal silicon layer or in a range from the surface to a predetermined inside position of the first single crystal silicon layer, at a position off the insulator of the semiconductor substrate; and forming a second semiconductor element in a range from a surface of the first single crystal silicon layer to at least inside of the second single crystal silicon layer, at a position off the insulator of the semiconductor substrate.

* * * * *